(12) United States Patent  (10) Patent No.: US 7,985,977 B2
Gogoi et al.                (45) Date of Patent:     Jul. 26, 2011

(54) SACRIFICIAL PILLAR DIELECTRIC PLATFORM

(75) Inventors: Bishnu Prasanna Gogoi, Scottsdale, AZ (US); David William Wolfert, Jr., Tempe, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 301 days.

(21) Appl. No.: 12/330,765

(22) Filed: Dec. 9, 2008

(65) Prior Publication Data

US 2009/0174040 A1  Jul. 9, 2009

Related U.S. Application Data

(60) Provisional application No. 61/012,880, filed on Dec. 11, 2007.

(51) Int. Cl.
*H01L 33/00* (2010.01)

(52) U.S. Cl. .......... 257/93; 257/374; 257/501; 257/506; 257/E29.01; 438/319; 438/421

(58) Field of Classification Search .......... None
See application file for complete search history.

(56) References Cited

U.S. PATENT DOCUMENTS

| | | | |
|---|---|---|---|
| 2002/0164867 A1* | 11/2002 | Joaquim et al. | 438/619 |
| 2006/0081958 A1* | 4/2006 | Averett et al. | 257/522 |
| 2008/0142923 A1* | 6/2008 | Tischler | 257/531 |

* cited by examiner

*Primary Examiner* — Evan Pert
*Assistant Examiner* — Scott Wilson
(74) *Attorney, Agent, or Firm* — Cool Patent, P.C.; Kenneth J. Cool

(57) ABSTRACT

Briefly, in accordance with one or more embodiments, a dielectric platform is at least partially formed in a semiconductor substrate and extending at least partially below a surface of a semiconductor substrate. The dielectric platform may include structural pillars formed by backfilling a first plurality of cavities etched in the substrate, and a second plurality of cavities formed by etching away sacrificial pillars disposed between the structural pillars. The second plurality of cavities may be capped to hermetically seal the second plurality of cavities to impart the dielectric constant of the material contained therein, for example air, to the characteristic dielectric constant of the dielectric platform. Alternatively, the second plurality of cavities may be backfilled with a material having a lower dielectric constant than the substrate, for example silicon dioxide where the substrate comprises silicon.

25 Claims, 5 Drawing Sheets

SACRIFICIAL PILLAR DIELECTRIC PLATFORM

TECHNICAL FIELD

Embodiments disclosed herein relate generally to electrical and semiconductor technology, and more specifically to a semiconductor structure that includes a dielectric structure or platform.

BACKGROUND

For some applications, such as high frequency or radio frequency ("RF") applications, it may be contemplated to form integrated passive devices using semiconductor processing technology or it may be contemplated to integrate passive devices such as inductors and/or capacitors together with active devices such as transistors using conductive silicon substrates. However, passive devices may have relatively low quality factors ("Qs") when these passive devices are formed on, or in relatively close proximity to, the conductive silicon substrate. In addition, due to parasitic capacitive coupling between these passive devices and the conductive silicon substrate, the frequency of operation of the integrated devices is reduced. Electrically conductive interconnects or busses may be used to electrically couple different devices within the die and external to the die. The frequency of operation may also be reduced by parasitic capacitive coupling between the interconnects and the conductive silicon substrate.

Further, it may be contemplated to physically and electrically isolate regions of a semiconductor substrate from each other. Additionally, some semiconductor devices, such as power transistors, provide relatively high output power, which may be utilized in some RF, industrial, and medical applications. Power transistor designers are continually seeking ways to efficiently increase output power by varying the output voltage and current characteristics of a power transistor. For example, it may be contemplated to have a power transistor that has an increased breakdown voltage to enable the power transistor to operate at a relatively higher voltage and provide a relatively higher output power.

Accordingly, it is contemplated to have semiconductor structures, and methods to make these structures, that may provide for reduced parasitic capacitances, relatively higher frequencies of operation, relatively higher breakdown voltages, relatively higher quality factor passive devices, increased isolation, or combinations thereof.

DESCRIPTION OF THE DRAWING FIGURES

Claimed subject matter is particularly pointed out and distinctly claimed in the concluding portion of the specification. However, such subject matter may be understood by reference to the following detailed description when read with the accompanying drawings in which:

Figure 1:
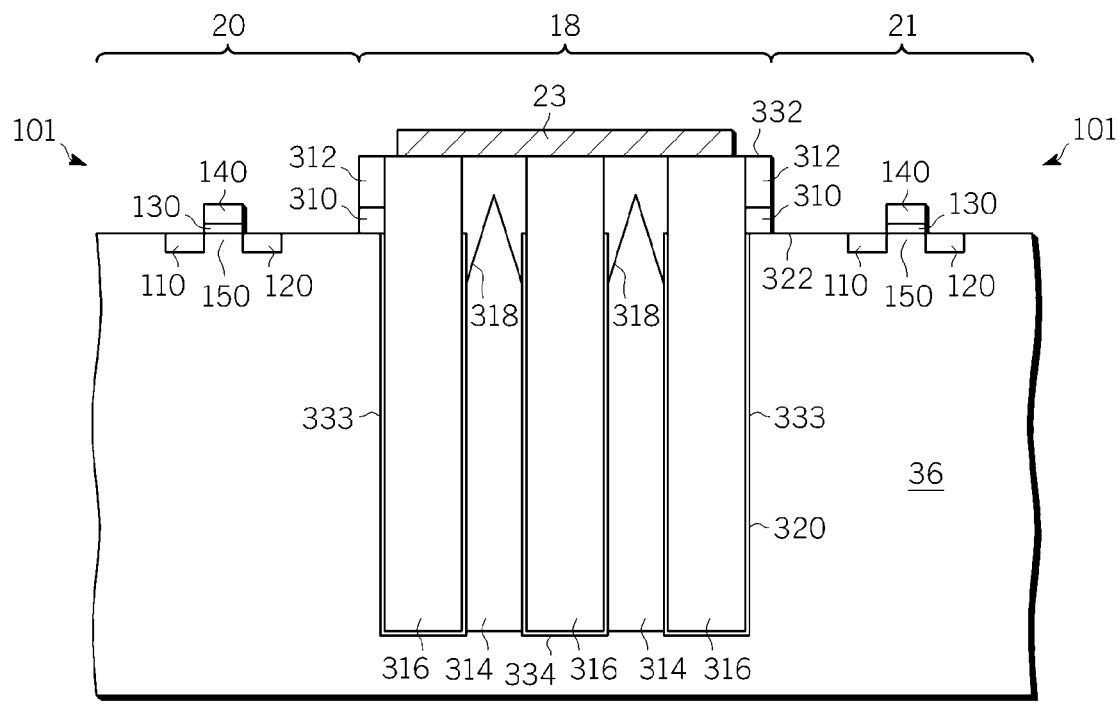
FIG. 1 is a cross-sectional view of a semiconductor structure having a dielectric platform formed therein in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect. In the following description and/or claims, the terms "comprise" and "include," along with their derivatives, may be used and are intended as synonyms for each other.

Referring now to FIG. 1, a cross-sectional view of a semiconductor structure 100 having a dielectric platform 18 formed therein in accordance with one or more embodiments will be discussed. Semiconductor structure 100 comprises a substrate 36, a dielectric platform (DP) 18, active regions 20 and 21, and an electrically conductive material 23. Dielectric platform 18 may be referred to generally as a dielectric structure or a dielectric region, and active regions 20 and 21 may also be referred to as active areas or active area regions. At least a portion of dielectric platform 18 may be formed below a top surface 322 of substrate 36. In some embodiments, a majority of dielectric platform 18 is below top surface 322 of substrate 36. In other embodiments, all of, or substantially all of, dielectric platform 18 is below top surface 322 of substrate 36.

Since in some embodiments at least a portion of dielectric structure 18 is formed in and below surface 322 of semiconductor substrate 36, dielectric structure 18 may be referred to as an embedded dielectric structure in such embodiments. Embedded may mean that at least a portion of dielectric structure 18 at least partially disposed below a plane (not shown) that is coplanar to, or substantially coplanar to, surface 322 of substrate 36. In some embodiments, the portion of dielectric structure 18 below such a plane may extend from the plane to a depth of at least about one micron or greater below the plane, and the portion of dielectric structure 18 below the plane may have a width of at least about three microns or greater, although the scope of the claimed subject matter is not limited in this respect. In other words, at least a portion of dielectric platform 18 may be embedded in semiconductor substrate 36 and may extend a distance of at least about one micron or greater from surface 322 into substrate 36, and the portion of dielectric structure 18 embedded in substrate 36 has a width of at least about three microns or greater in some embodiments.

Dielectric platform 18 of semiconductor structure 100 comprises voids 314, structures 316, dielectric material 320, and a capping material 318. Dielectric platform 18 may also include dielectric materials 310 and 312. In some embodiments, structures 316 may be a fill material such as, for example, a dielectric material.

Electrically conductive material 23 is over dielectric platform 18. As will be discussed further below, at least a portion of dielectric platform 18 may be between electrically conductive material 23 and substrate 36 to reduce parasitic capacitance between electrically conductive material 23 and substrate 36. In other embodiments, at least a portion of dielectric platform 18 is between at least a portion of electrically conductive material 23 and at least a portion of substrate 36 to reduce capacitance between electrically conductive material 23 and substrate 36.

As is discussed below, active devices, or portions of active devices, are formed in or from substrate 36. Substrate 36 may comprise a semiconductor material and active regions 20 and 21 may be formed in substrate 36. In some embodiments, substrate 36 may comprise silicon and may be referred to as a device layer or an active layer. Further, in some embodiments, substrate 36 may include one or more epitaxial layers. Substrate 36 may include an active area in which active devices, may be subsequently formed. In some embodiments, semiconductor material 36 may be formed on a substrate comprised of the same or a different material. In one example, semiconductor material 36 is silicon which is epitaxially grown on a silicon substrate. A substrate may mean a semiconductor material, one or more epitaxial layers formed on a semiconductor material, a semiconductor material disposed on an insulating material, or the like. Substrate 36 may also be referred to as a semiconductor substrate. Active regions 20 and 21 may be used as an active area where active devices, such as, for example, transistors or diodes, or portions of active devices, may be subsequently formed. Active devices may be formed in active regions 20 and 21 using conventional complementary metal oxide semiconductor (CMOS), bipolar, or bipolar-CMOS (BiCMOS) processes. In one or more embodiments, dielectric platform 18 is capable of isolating one or more transistor types from one or more other transistor types, and/or to isolate different regions of substrate 36 including surrounding and/or enclosing one or more areas of substrate 36. For example, in one or more embodiments, dielectric platform 18 may have a ring or annular type shape capable of enclosing or at least partially enclosing an area or region within the ring, to isolate the inner region of the ring from the outer region of the ring. In such an embodiment, an active region 20 may be disposed within the interior of the ring formed by dielectric platform 18 to be physically and/or electrically isolated from another active region 21 disposed exterior to the ring formed by dielectric platform 18. Likewise, dielectric platform 18 may comprise other various shapes and/or forms to provide isolation between two or more adjacent regions of substrate 36, and the scope of the claimed subject matter is not limited in this respect.

Substrate 36 may be doped with a chemical impurity or dopant such as, for example, boron, phosphorous, or arsenic, to establish its conductivity type (p-type or n-type) and resistivity. Substrate 36 may comprise a semiconductor material such as, for example, silicon, and may be doped or undoped depending on the application. Substrate 36 may have a thickness ranging from about 100 µm to about 1,000 µm. However, the thickness of substrate 36 may be reduced through subsequent thinning processes in some embodiments.

In some embodiments, the depth or thickness of dielectric platform 18 may range from about one micron to about one hundred microns (µm) and the width of dielectric platform 18 may be at least about five microns or greater. The depth of dielectric platform 18 may be measured from top surface 322 of substrate 36 to a lower boundary or surface 334 of dielectric platform 18. In some embodiments, the thickness of dielectric platform 18 may be about ten microns and the width of dielectric platform 18 may be about ten microns. In other embodiments, it may be desirable that the thickness of the dielectric platform be equal to, or approximately equal to, the thickness of semiconductor structure 100, that is, the thickness of the die.

Voids 314 may be adjacent and/or abutting structures 316 and may be referred to as cavities, air gaps, openings, trenches, empty regions, or empty spaces. In addition, as described herein, voids 314 may be hermetically sealed to prevent any contamination from undesirable gasses or moisture that may propagate into, or get trapped in, voids 314. When sealed, voids 314 may be referred to as sealed air gaps, sealed voids, sealed cavities, sealed trenches, closed cells, or closed cell voids.

Vertical structures 316 may be, for example, pillars, columns, walls, or partitions, and may comprise a dielectric material such as, for example, an oxide. Vertical structures 316 may be used to form one or more sealed voids or closed cells 314 in dielectric platform 18. Although three vertical structures 316 are shown in FIG. 1, the methods and apparatuses described herein are not limited in this regard. For example, in alternate embodiments, less than three or more than three vertical structures may be formed in dielectric platform 18.

In embodiments wherein multiple voids are formed in dielectric platform 18, dielectric platform 18 has a closed-cell configuration in that the voids 314 of dielectric platform 18 may be physically isolated from each other by vertical structures 316. Accordingly, if there is any rupture or fracture in dielectric platform 18, contamination from any gases in voids 314 may be contained in a limited area due to the closed-cell configuration, wherein the multiple voids of dielectric platform 18 are physically isolated from each other.

The combination of vertical structures 316 and voids 314 reduces the overall permittivity of the dielectric platform 18 so that dielectric platform 18 has a relatively low dielectric constant. In some embodiments, a dielectric constant of about at least about 1.5 or lower may be achieved by increasing the volume of voids 314. The dielectric constant of dielectric platform 18 is reduced compared to, for example, what would be provided by a dielectric platform that has no air gaps or voids. Additionally, reduced thermal stress is induced in substrate 36 compared to a solid or filled dielectric structure, because dielectric platform 18 includes substantial volumes that are not occupied by solids having coefficients of thermal expansion that differ from that of substrate 36. Thermal stress can lead to dislocations and undesirable excessive leakage currents in devices formed in substrate 36 and can also lead to undesirable stress during future processing of semiconductor structure 100 that may result in cracking of semiconductor structure 100. In contrast with other implementations of dielectric platform type structures that comprise relatively thicker thermal oxide layers, dielectric platform 18 as shown and described herein utilizes relatively thinner thermal oxide layers that would otherwise result in thermal stress and cause dislocations in semiconductor structure 100 resulting in leakage currents. Such other dielectric platform type structures can be constructed to have oxide layers greater than 1,000 angstroms to about 10,000 or more angstroms. Dielectric platform 18 as discussed herein can be constructed with relatively thinner oxide layers below 1,000 angstroms without suffering from such deleterious effects, although the scope of the claimed subject matter is not limited in this respect.

Silicon dioxide, also referred to as oxide, has a dielectric constant of about 3.9. Accordingly, a solid or filled dielectric structure that includes no voids and includes silicon dioxide may have a dielectric constant of about 3.9, although the scope of the claimed subject matter is not limited in this respect.

In some embodiments described herein, dielectric platform 18 includes voids occupying in excess of 40% of the total volume of dielectric platform 18. This may result in an effective dielectric constant reduction of about 30% or greater, from a dielectric constant of about 3.9 to an effective dielectric constant of about 2.74. In one embodiment, dielectric platform 18 includes voids occupying in excess of 50% of the total volume. This may result in an effective dielectric constant reduction of about 39%, from a dielectric constant of about 3.9 to an effective dielectric constant of about 2.39. Increasing the volume of air or empty space in dielectric platform 18 may result in a dielectric platform 18 having a dielectric constant of about 1.5 or less. Since empty space has the lowest dielectric constant (the dielectric constant of empty space is 1), the more empty space or void space incorporated into the dielectric platform, the lower the overall dielectric constant. Accordingly, increasing the volume of sealed cavities 314 relative to the volume of dielectric or semiconductor material in dielectric platform 18 is more effective in decreasing the dielectric constant of dielectric platform 18 compared to increasing the volume of dielectric material in dielectric platform 18. As a result, passive elements 23 formed over dielectric platform 18 have reduced parasitic capacitances to the substrate 36. The parasitic substrate capacitance is reduced by both the reduced effective dielectric constant of dielectric platform 18 and the increased thickness of dielectric platform 18.

Dielectric platform 18 may also be used to provide electrical isolation in semiconductor structure 100. For example, dielectric platform 18 may be used to electrically isolate active regions 20 and 21 from each other, which may also result in electrical isolation between any active devices such as, for example, transistors 101, formed in active regions 20 and 21.

In addition, dielectric platform 18 may be used to increase the frequency of operation of any devices formed using semiconductor structure 100. For example, passive components such as, for example, inductors, capacitors, resistors, or electrical interconnects, may be formed over the embedded dielectric platform 18 and may have reduced parasitic capacitive and inductive coupling between these passive components and silicon substrate 36 since the embedded dielectric platform 18 has a relatively low dielectric constant or permittivity and since the embedded dielectric platform 18 increases the distance between the passive components and the conductive substrate. In addition forming passive components over dielectric platform 18 may result in reduced inductive coupling. The parasitic substrate capacitance may be reduced by both the reduced effective dielectric constant of dielectric structure 18 and the increased thickness of dielectric structure 18. Reducing parasitic substrate capacitances may increase the frequency of operation of any devices formed using semiconductor structure 100. As an example, a passive component may comprise electrically conductive material 23, wherein electrically conductive material 23 may comprise, for example, aluminum, copper, gold, nickel, permalloy, or doped polycrystalline silicon. In various examples, the passive component may be an inductor, a capacitor, a resistor, or an electrical interconnect and may be coupled to one or more active devices formed in active regions 20 and 21.

Furthermore, dielectric platform 18 may be used to form relatively higher quality passive devices such as, for example, capacitors and inductors having a relatively higher quality factor (Q) since the dielectric platform 18 may be used to isolate and separate the passive devices from the substrate. Active devices, such as transistors or diodes, may be formed in regions such as regions 20 and 21 adjacent to, or abutting, dielectric platform 18, and these active devices may be coupled to and/or employ passive components such as spiral inductors, microstrip transmission lines or the like that are formed on a planar upper surface of dielectric platform 18. Separating the passive components from silicon substrate 36 allows higher Qs to be realized for these passive components.

As an example, a field effect transistor (FET) 101 may be formed in active regions 20 and 21. FET 101 may be a metal oxide semiconductor field effect transistor (MOSFET) and may include a source region 110 in a portion of substrate 36, a drain region 120 in a portion of substrate 36, a gate oxide 130 over a portion of substrate 36, a gate 140 over gate oxide 130, and a channel region 150 formed in a portion of substrate 36 under gate oxide 130 and between doped regions 110 and 120. The source, drain, and channel regions of a FET can be formed by forming a doped region in semiconductor substrate 14 and therefore the source, drain and channel regions of a FET may be referred to as doped regions.

In some embodiments, substrate 36 may serve as part of a drain region of a vertical transistor formed in active regions 20 or 21. In this example, a source contact or electrode (not shown) may be formed on or adjacent to an upper surface of substrate 36 and a drain electrode (not shown) may be formed on or adjacent to a lower surface of substrate 36. During operation, the electrical current flow from the source electrode to the drain electrode in the vertical transistor may be substantially perpendicular to the upper and lower surfaces of semiconductor structure 100. In other words, current flows essentially vertically through the vertical transistor from the electrode located adjacent a top surface 322 of semiconductor structure 100 to a drain electrode located adjacent to the opposite bottom surface of semiconductor structure 100. An example of a vertical transistor is described in U.S. patent application Ser. No. 10/557,135, entitled "POWER SEMI- CONDUCTOR DEVICE AND METHOD THEREFOR," filed Nov. 17, 2005, which claims priority to Patent Cooperation Treaty (PCT) International Application Number PCT/US2005/000205 entitled "POWER SEMICONDUCTOR DEVICE AND METHOD THEREFOR," having an International Filing Date of Jan. 6, 2005 and an International Publication Date of Jul. 28, 2005, the contents of both of these patent applications are incorporated herein by reference in their entireties.

Power transistors having relatively high breakdown voltages, and consequently relatively high output power, may be realized by forming a vertical transistor in an active area such as, for example, areas 20 and 21, adjacent to dielectric platform 18, as dielectric platform 18 may provide edge termination for the equipotential lines from an electric field in an active area that is adjacent to dielectric platform 18. In other words, dielectric platform 18 may be formed adjacent or abutting active regions to serve as the termination for field lines such as, for example, equipotential lines, during depletion of active devices such as, for example, vertical transistors (not shown) formed in active regions 20 and 21. Thus, equipotential lines may impinge on sidewalls 333 of dielectric platform 18. It may be desirable for sidewalls 333 to be straight and smooth and perpendicular to, or substantially perpendicular to, the top surface 322 of substrate 36 so that the equipotential lines are substantially perpendicular to sidewalls 333 of dielectric platform 18 adjacent or abutting the active area, so that a condition that is referred to as planar breakdown may be achieved where equipotential lines terminate at a perpendicular angle, or a substantially perpendicular angle, to sidewalls 333. Equipotential lines that impinge on sidewalls 333 at an angle that is not perpendicular to sidewalls 333 may decrease the breakdown voltage of active devices formed in the active area. Accordingly, higher breakdown voltages may be achieved as the edge termination provided by dielectric platform 18 may reduce curvature of the equipotential lines. As is generally understood, curvature of the equipotential lines results in lower breakdown voltages. To maximize breakdown voltage, the equipotential lines are parallel to, or substantially parallel to, top surface 322 of substrate 36, and these equipotential lines are planar with little to no curvature. In some embodiments, it may be desirable for sidewalls 333 to be a high quality dielectric material such as a silicon dioxide formed using thermal oxidation of silicon.

Dielectric platform 18 may be adjacent to, abutting, and/or surrounding, active regions 20 and 21 and in these embodiments may provide edge termination for terminating equipotential lines in the active regions, which may result in relatively higher breakdown voltages for some kinds of active devices such as, for example, vertical transistors, formed in the active regions. In addition, if dielectric platform 18 surrounds one or more active regions, then dielectric platform 18 may also be used to provide electrical isolation. For example, dielectric platform 18 may be used to electrically isolate active regions from each other, which may also result in electrical isolation between any active devices formed in the isolated active regions.

Although only a single active device is discussed as being formed active regions 20 and 21, the methods and apparatuses described herein are not limited in this regard. In some embodiments, a plurality of active devices may be formed in active regions 20 and 21.

In one or more embodiments, semiconductor structure 100 comprises an embodiment of dielectric platform 18, wherein dielectric platform 18 is at least partially formed in semiconductor structure 100 and at least partially extends below a surface 322 of semiconductor structure 100. Semiconductor structure 100 may comprise one or more layers, such as substrate layer 36, oxide layer 310, and/or nitride layer 312 wherein dielectric platform 18 may at least partially extend through one or more of such layers, and in one or more embodiments dielectric platform 18 at least partially extends into substrate layer 36. As shown in FIG. 1, dielectric platform 18 comprises one or more cavities, or gaps, 314, referred to generally as voids, for example to impart a characteristic of the dielectric constant of the material contained within cavities 314 to dielectric platform 18. In one or more embodiments, cavities 314 may contain air or a suitable gas, or may be filled in with a material such as a silicon oxide or the like. In general, the material contained within cavities 314 may be selected so that dielectric platform 18 has a relatively lower dielectric constant. In some embodiments, sealed cavities 314 are evacuated to a pressure less than atmospheric pressure. In other words, the pressure in sealed cavities 314 is below atmospheric pressure. As an example, the pressure in sealed cavities 314 may range from about 0.1 Torr to about 10 Torr. The type of substance or material within cavities 314 is not a limitation of the present invention. For example, sealed cavities 314 may contain solid matter or a fluid such as a gas or a liquid.

One or more of cavities 314 may be flanked by one or more structures 316, for example by being interspersed between structures 316, to provide desired properties to the structure of dielectric platform 18, for example to provide a sufficient amount of strength and/or stress relief to semiconductor structure 100 during the manufacturing process and/or during deployment of semiconductor structure 100 for its intended use. In other words, in some embodiments, one or more voids 314 are interspersed between portions of fill material 316. As discussed above, in some embodiments, structures 316 may be pillars, although the scope of the claimed subject matter is not limited in this respect.

Cavities 314 may be sealed with caps 318 disposed between pillars 316. Cavities 314 may further include a thin oxide layer 320 disposed on the interior surface thereof. Further details on the formation of dielectric platform 18 within semiconductor structure 100 are discussed, below. It should be noted that while the embodiments shown in FIG. 1 includes pillars 316 as an example, other structures or features may be utilized as well, for example walls, compartments, beams, trusses, columns, trenches, voids, protrusions, projections, extensions, and/or any other type of elongated structures and so on, and the scope of the claimed subject matter is not limited in this respect. Furthermore, semiconductor structure 100 as shown in FIG. 1 may include one or more structures such as, for example, active areas 20 and 21 including one or more respective FET devices 101. Likewise, dielectric platform 18 may be capped with caps 318. In other words, cavities 314 may be sealed, capped, or covered using a material 318, which in some embodiments may be a dielectric material. Although not shown, another optional dielectric layer may be formed over materials 316 and 318 to further seal cavities 314. This optional dielectric layer may be a conformal layer that seals, and in some embodiments, hermetically seals voids 314. This dielectric layer and material 318 may be referred to as sealing layers, capping layers, or capping structures. Accordingly, this optional conformal layer may fill any openings or cracks in material 318, and in general prevent the propagation of gases or moisture into sealed cavities 314. By way of example, the conformal sealing layer may be silicon nitride ($Si_3N_4$). In other embodiments, the sealing layer may be LPCVD low temperature oxide (LTO), LPCVD high temperature oxide (HTO), LPCVD TEOS, or LPCVD PSG.

In the example shown in FIG. 1, dielectric structure 18 may function to electrically and/or physically isolate active area 20 from active area 21. It should be noted that the areas and structures shown formed in and/or on semiconductor structure 100 are not necessarily shown to scale, and furthermore semiconductor structure 100 may include more or fewer areas and/or structures, and in different arrangements, and the scope of the claimed subject matter is not limited in this respect.

Figure 2:
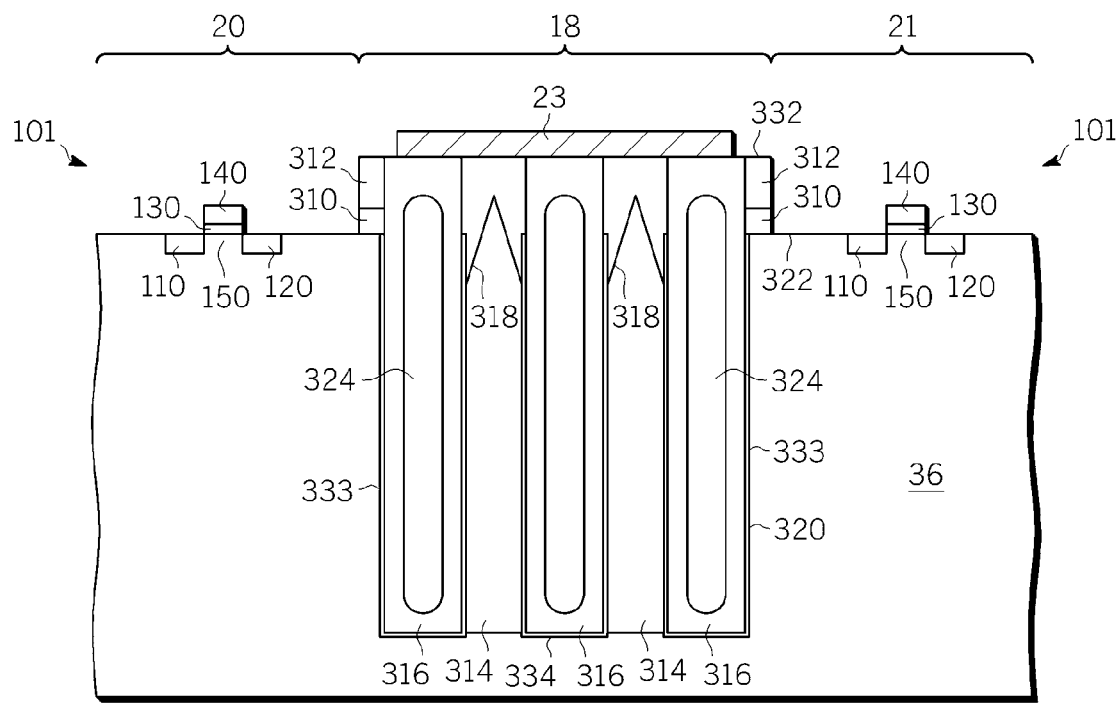
FIG. 2 is a cross-sectional view of an alternative embodiment of a semiconductor structure having a dielectric platform formed therein in accordance with one or more embodiments.

Referring now to FIG. 2, a cross-sectional view of an alternative embodiment of a semiconductor structure having a dielectric platform formed therein in accordance with one or more embodiments will discussed. The alternative embodiment of semiconductor structure 100 shown in FIG. 2 is similar to semiconductor structure 100 as shown in FIG. 1, except that in FIG. 2 pillars 316 may include one or more voids 324 formed therein whereas pillars 316 in FIG. 1 may be solid or at least nearly solid and not include any voids. Such voids 324 may be formed in pillars 316, for example to reduce the dielectric constant of dielectric platform 18 closer to the dielectric constant of empty space, for example where voids 324 may be filled with air and/or a gas material, while still providing the structure strength and integrity resulting from the refill material from which pillars 316 are composed, for example a tetraethyl orthosilicate (TEOS) oxide material or the like as discussed in further detail, below. In one or more embodiments, voids 324 in pillars 316 may be formed by forming pillars 316 as discussed, below, but by partially backfilling rather than completely backfilling with a TEOS material or the like. Alternatively, voids 324 may be formed by first forming pillars 316 and then at least partially etching pillars 316 thereby leaving a void formed in pillars 316. Furthermore, semiconductor structure 100 as shown in FIG. 2 includes one or more structures such as, for example, active areas 20 and 21 including one or more respective FET devices 101. Likewise, dielectric platform 18 may be capped with caps 318. In other words, cavities 314 may be sealed, capped, or covered using a material 318, which in some embodiments may be a dielectric material. In the example shown in FIG. 2, dielectric structure 18 may function to electrically and/or physically isolate active area 20 from active area 21. It should be noted that the areas and structures shown formed in and/or on semiconductor structure 100 are not necessarily shown to scale, and furthermore semiconductor structure 100 may include more or fewer areas and/or structures, and in different arrangements, and the scope of the claimed subject matter is not limited in this respect.

Figure 3:
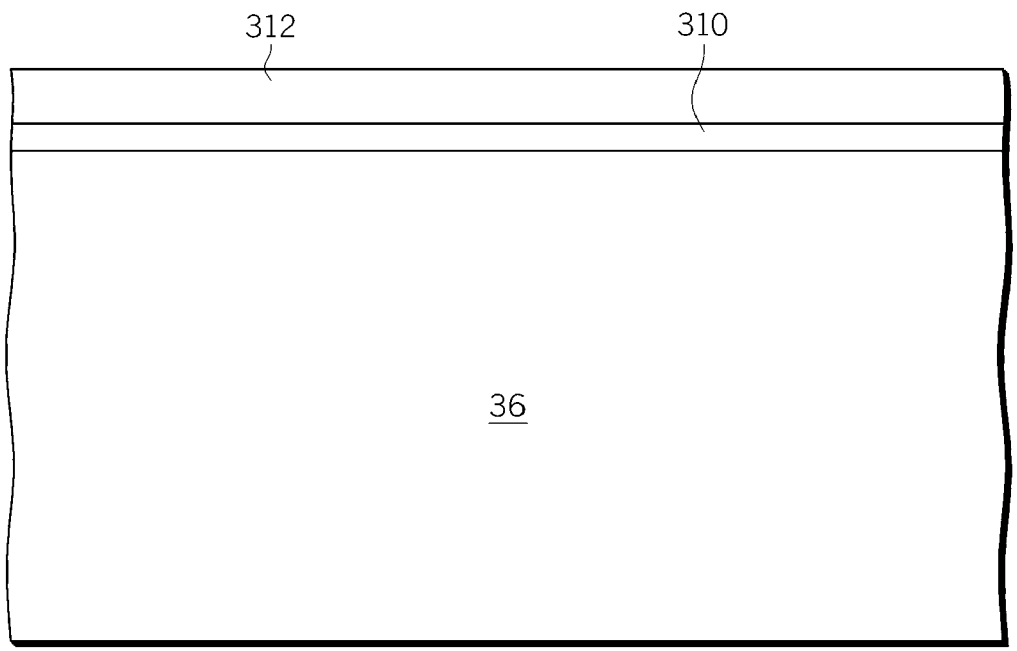
FIG. 3 is a cross-sectional view of a semiconductor structure in which a dielectric platform may be formed as shown in FIG. 1 or FIG. 2 at an earlier stage of formation in accordance with one or more embodiments.

Referring now to FIG. 3, a cross-sectional view of a semiconductor structure at an earlier stage of formation in accordance with one or more embodiments will be discussed. As shown in FIG. 3, semiconductor structure 100 may be formed by first depositing one or more masking layers, such as oxide layer 310 comprising, for example, silicon dioxide ($SiO_2$) on substrate 36 which for example may comprise silicon. Oxide layer 310 may be formed on substrate 36 via one or more processes such as, for example, thermal oxidation, or low pressure chemical vapor deposition (LPCVD) or the like. Oxide layer 310 may be formed to have a thickness ranging from about approximately 500 angstroms to about approximately 1000 angstroms. Likewise, after formation of oxide layer 310, one or more additional masking layers may be formed such as, for example, nitride layer 312 comprising, for example, silicon nitride ($Si_3N_4$) may be formed on oxide layer 310 using, for example, low-pressure chemical vapor deposition (LPCVD) or a similar process. In one or more embodiments, oxide layer 310 and/or nitride layer 312 may be formed using chemical vapor deposition (CVD) and/or low-pressure chemical vapor deposition (LPCVD) to provide insulation and/or to serve as a chemical barrier during the formation of the remainder of semiconductor structure 100. Nitride layer 312 may be formed to have a thickness ranging from about approximately 1000 angstroms to about approximately 2000 angstroms. However, other thicknesses for oxide layer 310 and/or nitride layer 312 may be provided, and the scope of the claimed subject matter is not limited in this respect. Alternatively, instead of using masking layers such as oxide layer 310 and/or nitride layer 312, one or more photoresist layers or masks may be used for etching of structures or features in silicon structure 100, for example cavities 510 as shown in and described with respect to FIG. 4, below.

Figure 4:
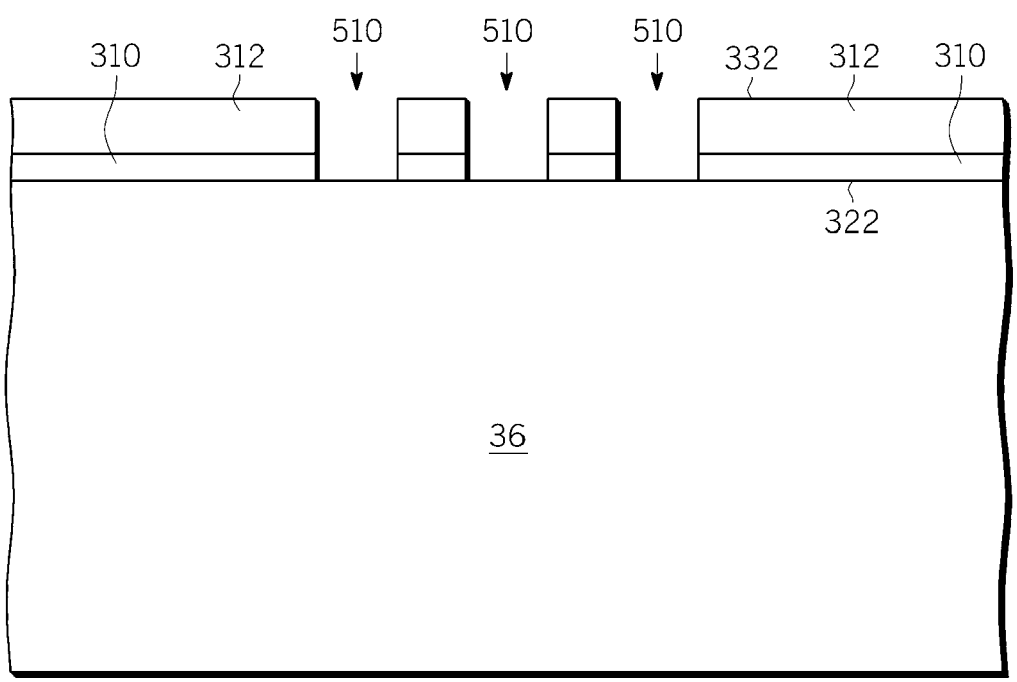
FIG. 4 is a cross-sectional view of the semiconductor structure of FIG. 3 at a later stage of formation.

Referring now to FIG. 4, a cross-sectional view of a semiconductor structure in which a dielectric platform may be formed as shown in FIG. 1 or FIG. 2 illustrating etching of an oxide layer and a nitride layer in accordance with one or more embodiments will be discussed. After formation of oxide layer 310 and/or nitride layer 312 as shown in FIG. 3, formation of structures 316 (FIGS. 1 and 2) of dielectric platform 18 (FIGS. 1 and 2) may be initially made by etching of the locations of structures 316 in oxide layer 310 and/or nitride layer 312. This may be accomplished by etching one or more cavities in nitride layer 312 and oxide layer 310, down to approximately where substrate layer 36 begins. In other words, portions of layers 312 and 310 may be removed using, for example, one or more etching operations that may stop on or in substrate 36. In one or more embodiments, cavities 510, which may also be referred to as trenches, voids, openings, gaps, and so on, may be etched to have a spacing of about approximately one micron to approximately two microns, and may have a width of about approximately one micron to approximately two microns. Such cavities 510 may be patterned to be at the locations of structures 316 (FIGS. 1 and 2) of the final dielectric platform 18 (FIGS. 1 and 2) and may be formed, for example, using a deep reactive-ion etch (DRIE) process or the like, although the scope of the claimed subject matter is not limited in this respect.

Alternatively, cavities 510 may be etched using a photolithography and etching type process that may involve the use of masks. The photolithography and etching may include forming a layer of a radiation-sensitive material, such as photoresist (not shown), on semiconductor structure 100, then exposing the photoresist using, for example, ultraviolet (UV) radiation to form a mask, and then etching portions of layers 310 and 312 using a reactive ion etch, a wet etch, or combinations thereof, to form openings, trenches, or cavities 510. Cavities 510 may be etched using a wet chemical etch or a dry etch process such as, for example, a reactive ion etch (RIE) and/or deep reactive ion etch (DRIE). The etching of cavities 510 may form sidewalls that are relatively straight or vertical. In other words, the sidewalls of cavities 510 may be perpendicular to, or substantially perpendicular to, top surface 322 of substrate 36. After the etching of cavities 510, the photoresist (not shown), if used, may be stripped or removed.

Figure 5:
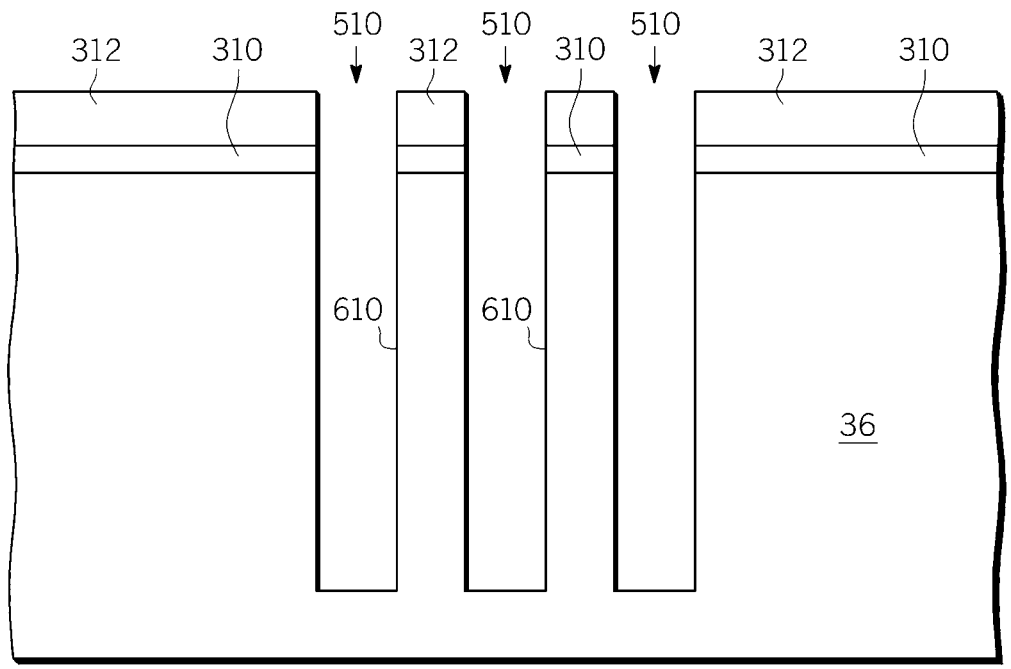
FIG. 5 is a cross-sectional view of the semiconductor structure of FIG. 4 at a later stage of formation.

Referring now to FIG. 5, a cross-sectional view of a semiconductor structure in which a dielectric platform may be formed as shown in FIG. 1 or FIG. 2 illustrating deep etching of the substrate in accordance with one or more embodiments will be discussed. After initial formation of cavities 510 in nitride layer 312 and/or oxide layer 310, cavities 510 may be further etched to extend deeper within substrate 36 using for example a deep etch process. In one or more embodiments, such as deep etch process may comprise a deep-reactive ion etch (DRIE) etch process or the like. Using such a deep etch process, cavities 510 may be extended at least partially through substrate 36 to a depth ranging from about one micron to about 100 microns deep, depending on the thickness of substrate 36 and/or the particular desired dimensions and properties of dielectric platform 18, although the scope of the claimed subject matter is not limited in this respect.

Figure 8:
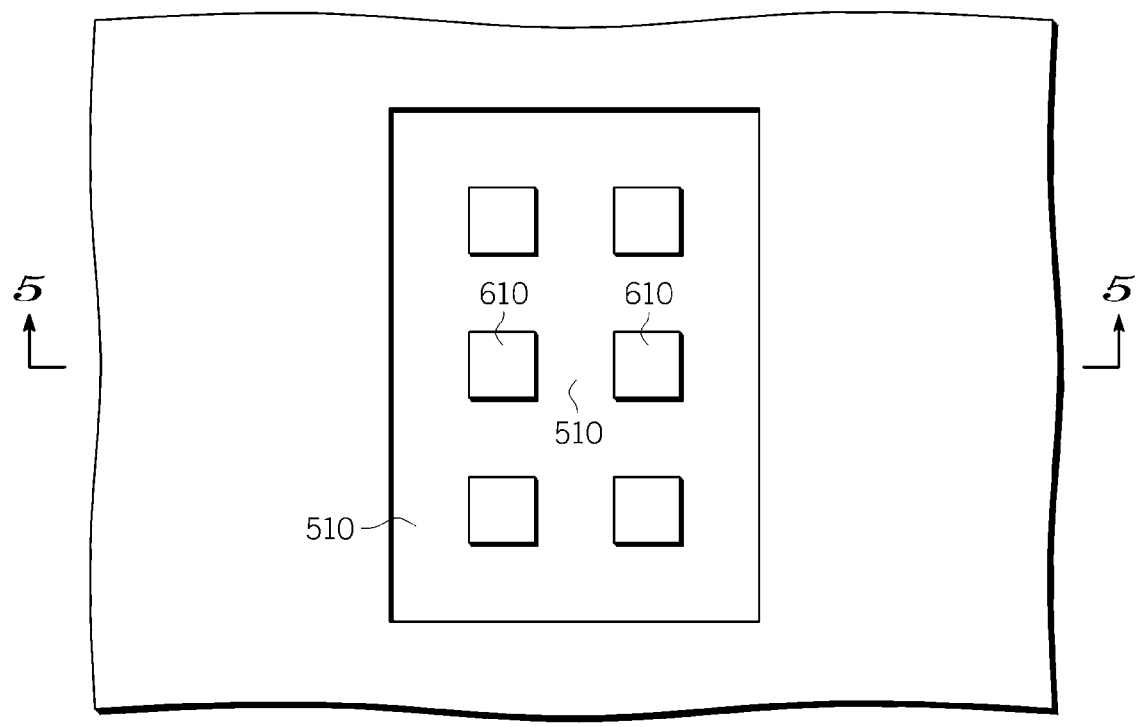
FIG. 8 is a top view of the semiconductor structure of FIG. 5 in accordance with one or more embodiments.

Briefly referring to FIG. 8, FIG. 8 is a top view of the structure of FIG. 5 in accordance with one or more embodiments, and FIG. 5 can be a cross-sectional view taken along section line 5-5 of FIG. 8. In the embodiment illustrated in FIG. 8, cavity 510 may be a singe cavity and structures 610 may be pillars, although the scope of the claimed subject matter is not limited in this respect. Although a square shaped cavity 510 is illustrated in FIG. 8, the scope of the claimed subject matter is not limited in this respect. Cavity 510 can have other shapes including a polygonal shape, a circular shape, or any other arbitrary shape. Although not shown, in other embodiments, dielectric platform 18 may be formed to surround a portion of substrate 36. Accordingly, cavity 510 may be formed around a portion of substrate 36. This may be desirable to isolate a portion of substrate 36 from another portion of substrate 36 using dielectric platform 18.

Figure 9:
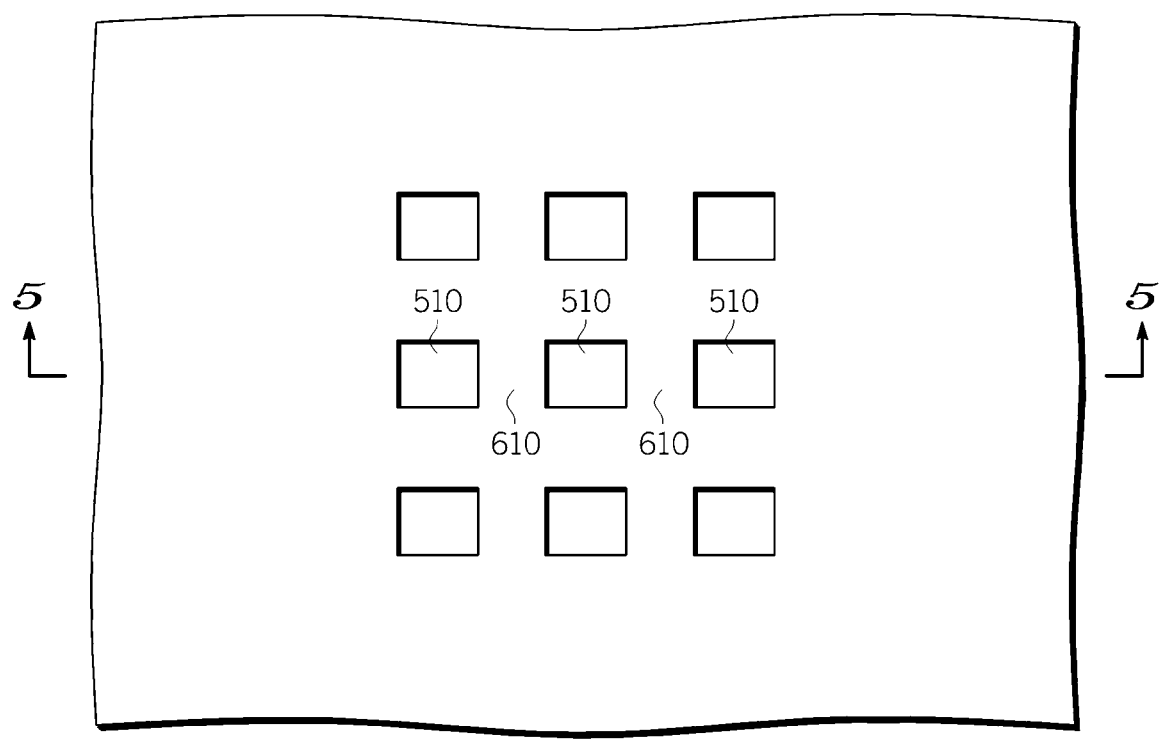
FIG. 9 is a top view of the semiconductor structure of FIG. 5 in accordance with one or more alternate embodiments.

Briefly referring to FIG. 9, FIG. 9 is a top view of the structure of FIG. 5 in accordance with another embodiment, and FIG. 5 can be a cross-sectional view taken along section line 5-5 of FIG. 9. In the embodiment illustrated in FIG. 9, cavities 510 may be multiple cavities and structure 610 may be a wall or partition, although the scope of the claimed subject matter is not limited in this respect.

Figure 6:
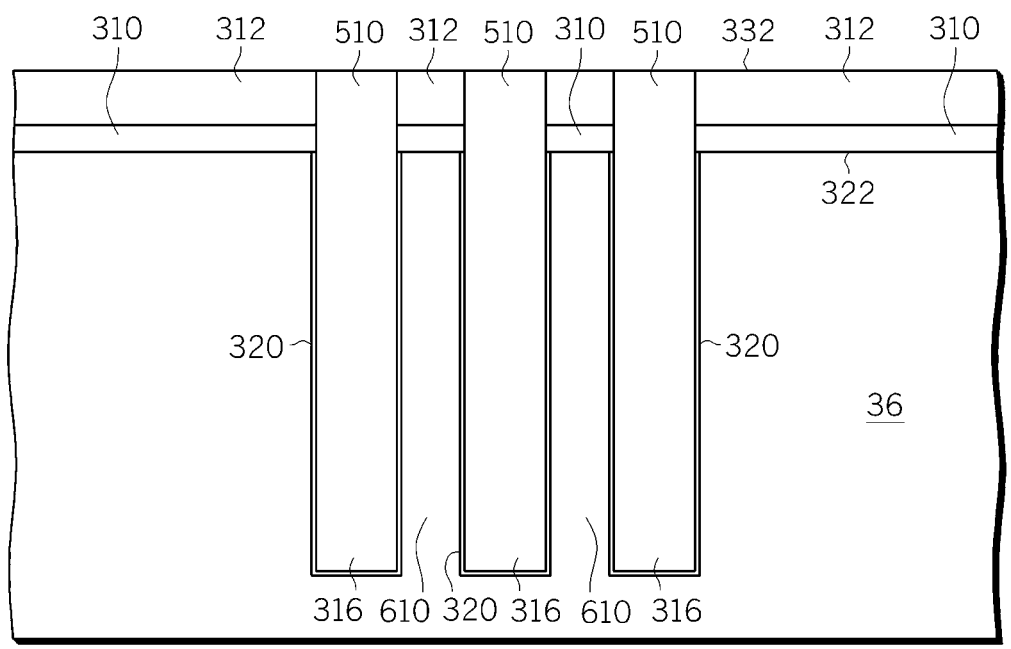
FIG. 6 is a cross-sectional view of the semiconductor structure of FIG. 5 at a later stage of formation.

Turning back to FIG. 5, in one or more embodiments, the etching of cavities 510 results in one or more sacrificial structures 610 that will be etched away in a subsequent process, for example as shown in and described with respect to FIG. 6. Sacrificial structures 610 may be pillars in some embodiments and may comprise portions of substrate 36 and portions of masking layers 310 and 312 resulting from the formation of cavities 510. It should be noted that while the embodiments shown in FIG. 5 includes sacrificial pillars 610 as an example, other structures may be utilized as well, for example walls, partitions, compartments, beams, trusses, columns, trenches, voids, protrusions, projections, extensions, and/or any other type of elongated structures and so on, and the scope of the claimed subject matter is not limited in this respect. Sacrificial pillars 610 are referred to as sacrificial since such structures will be etched away, or sacrificed, in a subsequent process in order to assist the formation of one or more other structures. A pillar structure that is not sacrificial may be referred to as a structural pillar. For example, structures 316 (FIGS. 1 and 2) may be pillars in some embodiments, and therefore, may be referred to as structural pillars, although the scope of the claimed subject matter is not limited in this respect. In one or more embodiments, as discussed in further detail below, cavities 510 may be backfilled to provide desired structural support of dielectric platform 18, and sacrificial pillars 610 may be etched away to provide corresponding cavities at the locations of sacrificial pillars 610 between structural pillars 316. The formation of such backfill structures and additional cavities is discussed in FIG. 6 and FIG. 7, below.

Referring now to FIG. 6, a cross-sectional view of a semiconductor structure in which a dielectric platform may be formed as shown in FIG. 1 or FIG. 2 illustrating partial oxidation of dangling bonds and backfilling of pillar cavities in accordance with one or more embodiments will be discussed. Once cavities 510 (FIG. 5) for pillars 316 are formed to a sufficient depth within substrate 36, pillars 316 may be formed by backfilling cavities 510. Prior to such backfilling, an oxidation process may be utilized to form a relatively thin layer of oxide 320 on the interior surfaces of cavities 510. Such an oxidation process may comprise partial oxidation of the substrate material 36, for example silicon, to form a thin silicon dioxide or thermal oxide layer 320 having a thickness of approximately 100 angstroms to approximately 300 angstroms. The formation of thin oxide layer 320 may be utilized to provide termination of dangling silicon atoms on the interior surfaces of cavities 510 that result from the etching process to allow a more complete backfill of cavities 510. Cavities 510 may then be backfilled with a suitable fill, refill, or backfill material to form structures 316. In some embodiments, fill material 316 may be a dielectric material. For example, cavities 510 may be backfilled with a suitable backfill material via a tetraethyl orthosilicate (TEOS) process to form pillars 316 comprising silicon dioxide. Such a TEOS backfill process may comprise a low pressure chemical vapor deposition (LPCVD) process or the like. In another embodiment, the backfill process may comprise an atmospheric deposition process (i.e., no vacuum) for example at or near approximately 760 mmHg, or may alternatively comprise a sub-atmospheric deposition process for example at or near approximately 700 mmHg. In yet further alternative embodiments, the backfill process may utilize a lower temperature oxide, a higher temperature oxide, a phosphosilicate glass (PSG), or the like, and the scope of the claimed subject matter is not limited in this respect. The type of deposition process selected for performing the backfill may be based at least in part on a desired characteristic of the depositing of the backfill material. In one or more embodiments, cavities 510 are backfilled with silicon dioxide up to nitride layer 312 to be planar with surface 332 of silicon structure 100. Surface 332 may be parallel to, or substantially parallel to, top surface 322 of substrate 36. If needed, a planar etch of surface 332 may be performed so that the upper portions of pillars 316 are flush with surface 332 of silicon structure 100, although the scope of the claimed subject matter is not limited in this respect. For example, the upper surface 332 of structure 100 may be planarized using, for example, a chemical mechanical planarization (CMP) technique. The backfilling of cavities 510 to result in pillars 316 provides structural integrity to allow sacrificial pillars 610 to be etched away to form cavities between pillars 316 as shown in and described with respect to FIG. 7, below.

Figure 7:
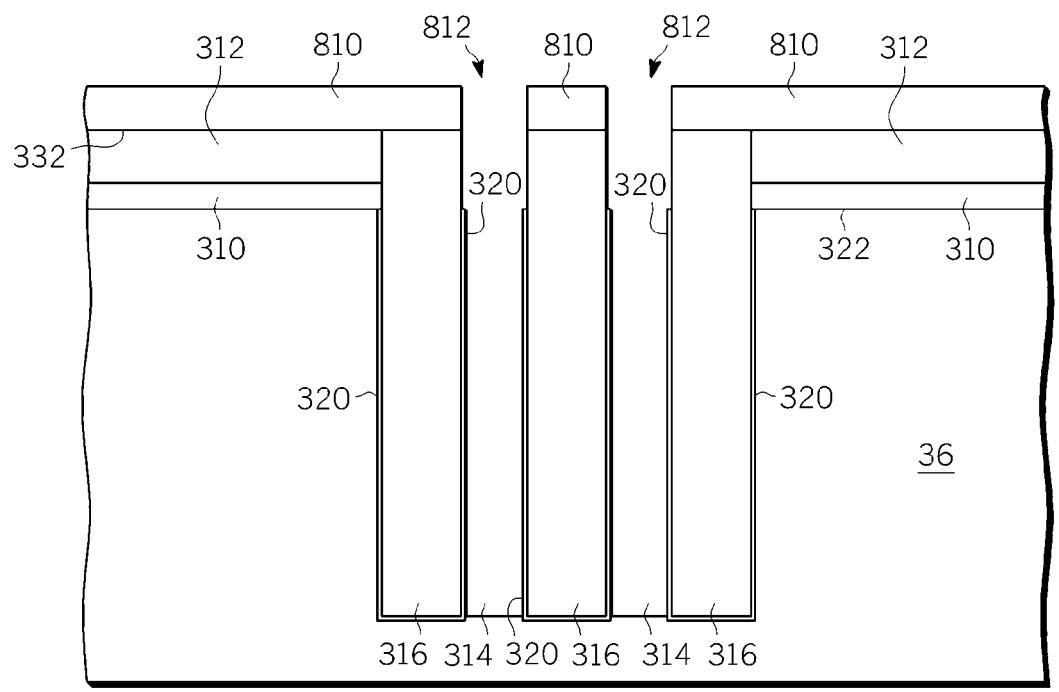
FIG. 7 is a cross-sectional view of the semiconductor structure of FIG. 6 at a later stage of formation.

Referring now to FIG. 7, a cross-sectional view of a semiconductor structure in which a dielectric platform may be formed as shown in FIG. 1 or FIG. 2 illustrating removal of one or more upper layers and etching pillars of the dielectric platform in accordance with one or more embodiments. After pillars 316 are formed via backfilling of cavities 510, cavities 314 may be formed as shown in FIG. 7 by removing sacrificial pillars 610 (FIG. 6) existing between pillars 316 using, for example, one or more etching operations. A photoresist layer 810 may be formed on nitride layer 312 to pattern locations where cavities 314 are to be formed between pillars 316 at gaps 812 of photoresist layer 810 using photolithography and etching. The photolithography and etching process may remove nitride layer 312, oxide layer 310, and at least partially etch away substrate layer 36 down to approximately the same or nearly the same depth as pillars 316 to form cavities 314. In one or more embodiments, cavities 314 may be etched to a depth of about approximately one micron to about approximately 100 microns. The thin oxide layer 320 formed as discussed, above, may remain after etching of cavities 314.

After formation of cavities 314, photoresist layer 810 may be removed or stripped and cavities 314 may be either backfilled by an additional TEOS process, or alternatively cavities 314 may be capped with caps 318 as shown in FIG. 1 or FIG. 2 formed by an additional deposition process such as plasma enhanced chemical vapor deposition (PECVD) or low pressure chemical vapor deposition (LPCVD). A planarization process may then be performed to make the top structures of cavities 314, either a TEOS backfill material or caps 318, flush with surface 332 of semiconductor structure 100. As a result, dielectric platform 18 as shown FIG. 1 or FIG. 2 may be formed. In some embodiments, additional structures may be disposed on and/or proximate to dielectric platform 18, for example electrically conductive material 23 as shown in FIG. 1 and FIG. 2, active devices 101 in active region 20 or active region 21, a field area (not shown), passive devices (not shown), and so on, and the scope of the claimed subject matter is not limited in this respect.

Accordingly, various structures and methods have been disclosed to provide a relatively thick, embedded dielectric platform that may be a dielectric support structure capable of supporting one or more passive devices over the dielectric platform. In various embodiments, the disclosed dielectric platform may provide electrical isolation, reduce parasitic substrate capacitance, allow for the formation of passive devices having a relatively high Q, and enable relatively higher frequency of operation or enable relatively higher breakdown voltages of any devices formed using, or in conjunction with, a structure that includes the dielectric platform. In addition, the disclosed dielectric platform and the methods for making the dielectric platform may reduce thermal stress that may be imparted to regions adjacent to the dielectric platform compared to other techniques and structures.

Although the claimed subject matter has been described with a certain degree of particularity, it should be recognized that elements thereof may be altered by persons skilled in the art without departing from the spirit and/or scope of claimed subject matter. It is believed that the subject matter pertaining to a sacrificial pillar dielectric platform and/or many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A semiconductor structure, comprising:
    a substrate comprising a semiconductor material; and
    a dielectric region formed in the substrate, the dielectric region comprising:
        one or more cavities extending into the substrate;
        a fill material formed substantially inside the one or more cavities;
        an oxide layer formed on the walls and bottoms of the one or more cavities and between the cavities and the fill material;
        one or more voids interspersed between portions of the fill material; and
        a cap formed over the one or more voids interspersed between portions of the fill material and at least partially extending into the one or more voids;
        the fill material further comprising one or more voids in the fill material.

2. A semiconductor structure as claimed in claim 1, wherein the oxide layer has a thickness of about 1,000 angstroms or lower.

3. A semiconductor structure as claimed in claim 1, the fill material comprising a plurality of one or more of the following structures: pillars, walls, compartments, beams, trusses, columns, trenches, voids, protrusions, projections, extensions, elongated structures, or combinations thereof.

4. A semiconductor structure as claimed in claim 1, wherein the substrate comprises silicon.

5. A semiconductor structure as claimed in claim 1, wherein the fill material comprises a dielectric material.

6. A semiconductor structure as claimed in claim 1, wherein the fill material, or a material contained in the voids interspersed between the fill material or in the fill material, or combinations thereof, has a lower dielectric constant than the substrate.

7. A semiconductor structure as claimed in claim 6, wherein the material comprises air, an inert gas, or a silicon oxide material, or combinations thereof.

8. A semiconductor structure as claimed in claim 1, wherein the cap formed over the one or more voids interspersed between the portions of the fill material at least partially hermetically seals the one or more voids interspersed between the portions of the fill material.

9. A semiconductor structure as claimed in claim 8, wherein the cap is planarized to be flush, or nearly flush, with the top surface of the fill material.

10. A semiconductor structure as claimed in claim 8, wherein the cap at least partially extends into the voids interspersed between the portions of the fill material to a depth of about one to four microns below the top surface of the fill material.

11. A semiconductor structure as claimed in claim 1, wherein the fill material comprises silicon dioxide formed via a tetraethyl orthosilicate (TEOS) process.

12. A semiconductor structure as claimed in claim 1, wherein the one or more voids interspersed between portions of the fill material contain silicon dioxide formed via a tetraethyl orthosilicate (TEOS) process.

13. A semiconductor structure as claimed in claim 1, wherein the fill material extends about one micron to about 100 microns into the substrate.

14. A semiconductor structure as claimed in claim 1, wherein the fill material comprises a plurality of structures, one or more of the plurality of structures having a width of about one to two microns, or being spaced apart at about one to two microns, or combinations thereof.

15. A method to form a semiconductor structure, comprising:
    forming a plurality of voids in a substrate, the voids being etched in the substrate to a depth of about one or more microns from a surface of the substrate, having a width of about one to two microns, and being spaced apart at a pitch of about one to two microns;
    forming a first dielectric material on the sidewalls and bottoms of the plurality of voids;
    filling the plurality of voids at least partially with a second dielectric material, wherein the second dielectric material contains one or more voids in the second dielectric material after said filling;
    forming one or more additional voids adjacent the second dielectric material; and
    sealing the one or more additional voids with a third dielectric material, the third dielectric material at least partially extending into the one or more additional voids.

16. A method as claimed in claim 15, wherein the first dielectric material has a thickness of less then about 1,000 angstroms.

17. A method as claimed in claim 15, wherein forming one or more additional voids comprises etching one or more additional voids adjacent the second dielectric material and sealing the one or more additional voids comprises at least partially hermetically sealing the one or more additional voids with the third dielectric material, wherein the one or more additional voids are interspersed between the second dielectric material.

18. A method as claimed in claim 17, further comprising at least partially planarizing the third dielectric material to be flush, or nearly flush, with the surface of the second dielectric material.

19. A method as claimed in claim 15, said filling comprising depositing silicon dioxide via a tetraethyl orthosilicate (TEOS) process to at least partially fill the plurality of voids.

20. A method as claimed in claim 15, further comprising depositing silicon dioxide into the one or more additional voids between the second dielectric material via a tetraethyl orthosilicate (TEOS) process.

21. A semiconductor structure, comprising:
a substrate having a first region and a second region; and
a dielectric region formed in the substrate and at least partially isolating the first region from the second region, the dielectric region comprising:
a fill material, the fill material extending into the substrate to a depth of about one micron to about 100 microns;
a first dielectric layer surrounding the sidewalls and bottom of the fill material, the first dielectric layer having a thickness of about 1,000 angstroms or lower;
one or more voids adjacent the fill material, the one or more voids having a width of about one micron to about two microns, or being spaced apart at a pitch of approximately one to approximately about two microns, or combinations thereof; and
a cap formed over the one or more voids adjacent the fill material and at least partially extending into the one or more voids; the fill material further comprising one or more voids formed in the fill material.

22. A semiconductor structure as claimed in claim 21, wherein the fill material comprises silicon dioxide formed via a tetraethyl orthosilicate (TEOS) process.

23. A semiconductor structure as claimed in claim 21, wherein the one or more voids adjacent the fill material contain silicon dioxide formed via a tetraethyl orthosilicate (TEOS) process.

24. A semiconductor structure as claimed in claim 21, wherein the one or more voids adjacent the fill material are interspersed between portions of the fill material and the fill material is a dielectric material.

25. A semiconductor structure as claimed in claim 21, wherein the fill material, or a material contained in the voids adjacent the fill material or in the fill material, or combinations thereof, has a lower dielectric constant than the substrate.

* * * * *